United States Patent [19]

Rach

[11] Patent Number: 5,750,315
[45] Date of Patent: May 12, 1998

[54] COMPRESSIBLE PRINTING PLATES AND MANUFACTURING PROCESS THEREFOR

[75] Inventor: Joseph F. Rach, Newark, Del.

[73] Assignee: MacDermid Imaging Technology, Inc., Waterbury, Conn.

[21] Appl. No.: 669,890

[22] Filed: Aug. 13, 1996

[51] Int. Cl.$^6$ .............................. G03F 7/095; G03F 7/16
[52] U.S. Cl. ................. 430/306; 430/325; 430/327; 430/271.1
[58] Field of Search .................... 430/306, 325, 430/327

[56] References Cited

U.S. PATENT DOCUMENTS

| | | | |
|---|---|---|---|
| 2,760,863 | 8/1956 | Plambeck, Jr. | 430/300 |
| 3,990,897 | 11/1976 | Zuerger et al. | 430/306 X |
| 4,332,873 | 6/1982 | Hughes et al. | 430/271.1 |
| 4,582,777 | 4/1986 | Fischer et al. | 430/271.1 |
| 4,869,997 | 9/1989 | Koch et al. | 430/306 X |
| 5,006,447 | 4/1991 | Umeda et al. | 430/271.1 |
| 5,629,052 | 5/1997 | Trokhan et al. | 427/508 |

FOREIGN PATENT DOCUMENTS

| | | |
|---|---|---|
| 0057593A2 | 8/1982 | European Pat. Off. . |
| 57-136652A | 8/1982 | Japan ........................ 430/306 |

Primary Examiner—Cynthia Hamilton
Attorney, Agent, or Firm—John L. Cordani

[57] ABSTRACT

A compressible printing plate is prepared by casting liquid photopolymerizable resin directly onto a compressible material having open cells on its surface. The photopolymerizable resin is incompletely cured by exposure to actinic radiation, preferably in the absence of a coverfilm covering the photopolymerizable resin. A further layer of photopolymerizable resin is then cast onto the incompletely cured resin, and the whole exposed to actinic radiation through an image-bearing transparency. A release composition may be placed between the image-bearing transparency and the photopolymerizable resin to provide for decreased adhesion therebetween. After development, an image-bearing laminate suitable as a printing plate for flexographic printing is obtained. The printing plate achieves excellent short and long term adhesion between the compressible layer and the photopolymer plate, without the necessity of a tie layer or adhesive therebetween.

20 Claims, 2 Drawing Sheets

COMPRESSIBLE PRINTING PLATES AND MANUFACTURING PROCESS THEREFOR

FIELD OF THE INVENTION

This invention relates to printing operations, and more particularly to printing plates having a relief image formed from a photopolymerizable resin composition, useful in flexographic printing, and to methodology to manufacture same.

BACKGROUND OF THE INVENTION

In flexographic printing, also known as relief printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at high speed such that the raised surface of the printing plate contacts a pool of ink, is slightly wetted by the ink, then exits the ink pool and contacts a substrate web, thereby transferring ink from the raised surface of the plate to the substrate to form a printed substrate.

Flexographic printing competes with other forms of printing, e.g., lithography, gravure and letterpress printing. Those involved in the flexographic printing industry are constantly striving to improve the flexographic printing process in order to more effectively compete with other printing methods. One area which has received much attention from researchers is the development of improved plates for flexographic printing.

A common approach currently used to make flexographic printing plates utilizes a photopolymerizable, also known as a photosensitive, photoimageable, photopolymer, photohardenable or photocurable, resin composition. While many different photopolymerizable resin compositions are known, they share the quality that upon exposure to certain wavelengths of light, the resin reacts with itself to form a structure that is insoluble in ink. Thus, photopolymerizable resin compositions may be used to form a hard, ink-insoluble, raised surface for photopolymer plates.

To prepare a printing plate with typical commercially available equipment, an image-bearing transparency or negative, i.e., a transparent film having opaque regions corresponding to the reverse of the image which one desires to impart to a printing plate, is placed on a glass platen, and covered with a transparent, polymeric coverfilm such as polypropylene. The transparency and coverfilm are secured by vacuum to the platen, and a layer of photopolymerizable resin is placed on the coverfilm while simultaneously laminating a backing sheet, also sometimes called a substrate, to the top of the resin. Then actinic radiation is shined through the glass platen toward the backing sheet. The regions of the resin which are impinged by the actinic radiation undergo polymerization to form an insoluble structure. The polymerization of the resin is known as curing, and the product of the polymerization is known as a cured resin.

The regions of the resin layer which were protected from the actinic radiation by the opaque regions of the transparency are washed away using developer solution, in a step called the development step. The cured regions are insoluble in the developer solution, and so after development a relief image formed of cured photopolymerizable resin is obtained. The cured resin is likewise insoluble in certain inks, and thus may be used in flexographic printing as described above. U.S. Pat. No. 2,760,863 to Plambeck describes another typical process for preparing a printing plate using photopolymerizable resin, wherein the image-bearing transparency is placed above the photopolymerizable layer, rather than underneath the coverfilm.

A common variation on the above-described process is to expose a liquid photopolymerizable resin to actinic radiation from two sides of the resin layer. See, for example, U.S. Pat. No. 3,848,998 to Yonekura et al. The recognized advantages of exposing from the back (through a backing sheet) as well as the front (through an image-bearing transparency) include better adhesion of the photopolymeric composition to the backing sheet, better relief image formation, and overcoming the inhibition to polymerization of photopolymerizable resin that is exposed to oxygen with increased control over the relief image height.

Flexographic printing plates desirably work under a wide range of conditions. For example, they should be able to impart their relief image to a wide range of substrates, including cardboard, coated paper, newspaper, calendared paper, and polymeric films such as polypropylene and the like. Importantly, the image should be transferred quickly and with fidelity, for as many prints as the printer desires to make. In consequence, and as evidenced by, e.g., the patent literature, considerable attention has been paid to the development of photopolymerizable resin compositions which have properties tailored to the specific end-use for the plate.

One substrate for which the development of flexographic printing plates has proved particularly troublesome is cardboard and other like substrates that have an uneven surface. With such substrates, the printing plate must be flexible so that it will conform to the uneven surface and evenly deliver a coating of ink thereon. However, if the plate is too soft or flexible, the image on the plate will distort under the pressure used to contact the plate with the substrate, and thus will not transfer the image with the desired fidelity. Printing plates which have been described in the prior art as being suited for uneven substrates are known as compressible printing plates.

Several approaches have been reported for the preparation of a compressible printing plate. In one approach, the plate is designed to give a low durometer reading. This approach, however, leads to an undesirable growth of the characters under the required printing impression pressure, particularly when printing on rough or uneven stock or on presses with uneven impression and/or plate cylinders.

Another commonly used technique is to adhere a layer of a compressible foam material to the back of a previously formed printing plate. In this way, one can use a fairly hard, i.e. high durometer, plate which will not provide a distorted image, and take advantage of the compressibility of the foam backing to allow the plate to bend and flex, and thereby contact all regions of an uneven substrate. A persistent problem with this approach is that it is very difficult to position the foam materials to the back of the plate. Typically, an adhesive is positioned between the plate and the foam. However, it is hard to apply the adhesive uniformly, and foam materials exhibit the problem that they stretch during mounting to the plate and, if stabilized, cause buckling when the plate is flexed.

Another technique for compressible plate manufacture is disclosed in European Patent Application No. 82300478.3, assigned to Uniroyal, Inc (the Uniroyal process). According to the Uniroyal process, a compressible foam layer is adhered to the base area of a polymer layer. The adhesion is preferably accomplished with a highly tacky adhesive or adhesive tape, however other forms of bonding such as urethane, epoxy, cyanoacrylate, anaerobic or hot melt bonding are not excluded. In addition to the use of an adhesive, the Uniroyal process is awkward because a layer of solid photopolymer material must be pre-back-exposed to light before it is laminated to the foam layer, thus involving a multiplicity of steps and not allowing variability in the thickness of the hardened layer.

More recently, U.S. Pat. No. 4,582,777 to Fischer et al. has disclosed a compressible printing plate that can be made using a liquid photopolymer composition. According to Fischer, a base layer, which may be metal or polymer film, is joined to the bottom of a compressible layer, which may be foam, with an adhesive or tie coat layer therebetween. The top of the compressible layer is also covered with a tie coat layer such as polyvinylidene chloride. A liquid photopolymer composition is then coated onto the tie coat layer, and exposed to ultraviolet radiation to cure the resin. In Fischer, a tie coat layer is disclosed as being necessarily positioned between the compressible and photocurable layer, and thus direct bonding, i.e., bonding without any intermediate material, is not achieved between the compressible material and photocurable resin of Fischer.

U.S. Pat. No. 5,006,447 to Umeda et al. comments on compressible plates formed from a foam layer, an intermediate adhesive layer and a layer of photosensitive resin. Umeda et al. report that materials present in a layer of cured photosensitive resin may transfer to the surface of a cellular foam layer and thereby reduce the adhesion between the cured photosensitive resin and the adhesive layer on the foam layer. Umeda et al. disclose a process wherein adhesive can successfully be used to adhere a foam substrate to a light-exposed photosensitive resin layer.

The most common means currently used to achieve a compressible printing plate is to tape or otherwise adhere a compressible backing sheet to a cured, image-bearing photocured resin composition. As detailed above, this approach is problematic. There is a need in the art for a simple, easily prepared, compressible photopolymer plate that overcomes the shortcomings of plates made according to prior art methodology.

SUMMARY OF THE INVENTION

The invention provides a process for forming a laminate bearing a relief image, comprising steps (a), (b) and (c). Step (a) comprises directly coating a surface of a compressible layer with a floor layer comprising at least one layer of a photopolymerizable resin, and exposing said floor layer to first actinic radiation exposure to provide an incompletely cured floor layer. The surface of the compressible layer has open cells. Step (b) comprises coating the incompletely cured floor layer of step (a) with at least one layer of a photopolymerizable resin to provide a relief layer, and exposing said incompletely cured floor layer and said relief layer to second actinic radiation exposure passed through an image-bearing transparency to provide a substantially cured floor layer and partially cured relief layer. Step (c) comprises developing the partially cured relief layer of step (b) to provide a laminate bearing a relief image.

Another aspect of the invention is an image-bearing laminate which may be prepared by the aforedescribed process. The laminate comprises a cured photopolymerizable resin layer in direct contact with a first of two sides of a compressible layer, wherein said compressible layer has a surface comprising open cells.

A further aspect of the invention is a method for imparting an image to a layer of photopolymerizable resin using a film having transparent and opaque regions, wherein said transparent regions correspond in area to the image to be imparted. The method comprises the steps (a) coating a film with a release composition comprising lecithin, wax, organic solvent and a film-forming ingredient selected from the group consisting of nitrocellulose, ethyl cellulose and polysilicate, (b) laying the coated film on a layer of photopolymerizable resin such that the coating contacts the resin, (c) directing actinic radiation into the resin to achieve insolubility in selected regions of the resin; and (d) developing the resin to remove soluble resin regions and to leave insoluble resin regions corresponding in area to the image to be imparted.

BRIEF DESCRIPTION OF THE DRAWINGS

The foregoing summary, as well as the following detailed description of the preferred embodiments of the invention, will be better understood when read in conjunction with the appended drawings. For the purpose of illustrating the invention, there are shown in the drawing embodiments which are presently preferred. It should be understood, however, that the invention is not limited to the precise arrangements and instrumentalities shown. In the drawings.

DETAILED DESCRIPTION OF THE INVENTION

The invention provides a process for preparing a laminate bearing a relief image, which may be used as a printing plate for flexographic or other types of printing. Before describing the inventive process and plate made therefrom, a summary of the prior art practice for making flexographic printing plates will be presented, with reference to FIG. 1.

Figure 1:
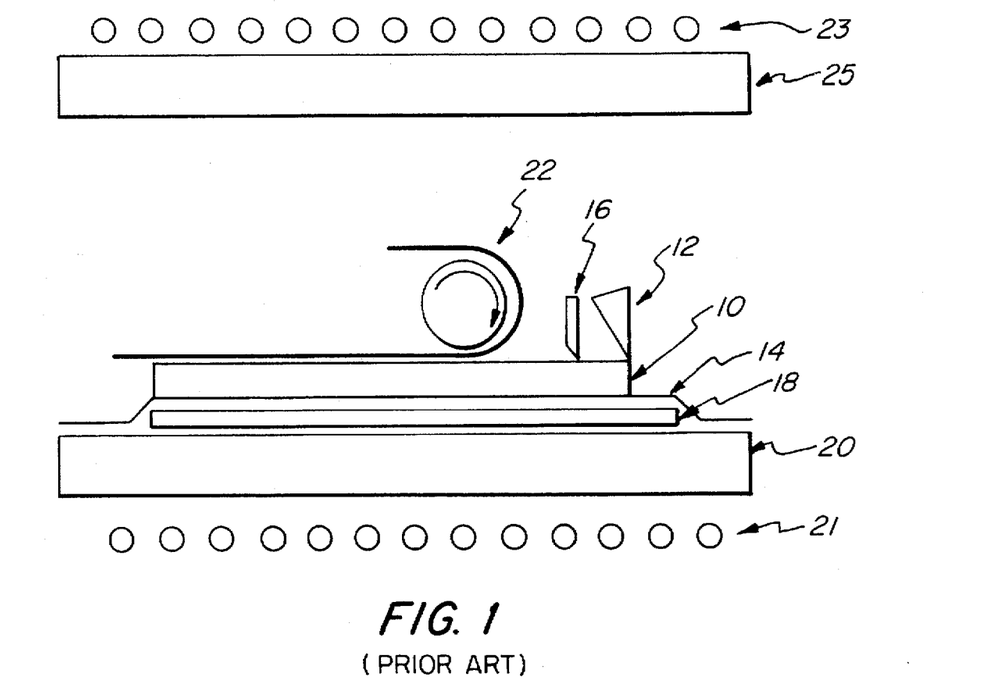
FIG. 1 is a diagrammatic illustration of a printing plate manufacturing process according to the prior art.

FIG. 1 illustrates part of a typical printing plate manufacturing process according to the Merigraph® system sold by Hercules Incorporated (Wilmington, Del.). In this process, a liquid photopolymerizable resin 10 is released from a resin reservoir 12, and is cast onto a coverfilm 14 with the aid of a leveling blade 16. The coverfilm 14 is positioned directly over, and is thus protecting, an image-bearing transparency 18. A glass platen 20 is positioned between the image-bearing transparency 18 and a source 21 of actinic radiation, where the source may be a bank of fluorescent tubes, as shown in FIG. 1.

Substantially simultaneously with casting the photopolymerizable resin 10, a substrate 22, which is a polymeric film, preferably a polyester sheet such as Mylar® polymer sheet, is placed on the layer of photopolymerizable resin 10. Mylar® is a trademark of E. I. du Pont de Nemours and Company, Wilmington, Del. A second source of actinic radiation 23 is positioned above the substrate 22. A glass platen 25 is positioned between the substrate 22 and the second source of actinic radiation 23 to provide a means for controlling thickness uniformity of the later of photopolymerizable resin 10, by lowering the glass platen prior to exposure to rest on shims and make contact with the substrate.

The photopolymerizable resin is then imaged from the top and bottom, i.e., actinic radiation is generated from sources 21 and 23 and directed into the photopolymerizable resin 10. Upon exposure to actinic radiation, the photopolymerizable resin polymerizes and changes from a liquid to a solid state, to form both a floor and a raised relief image of a photopolymer layer. The relief side of the photopolymer layer is thus seen to be facing downward, toward the glass platen 20, while the floor layer faces upward, in contact with the substrate 22.

The photopolymer layer is then removed from the glass platen 20, and processed to remove the unexposed photopolymer layer and post exposed to finish the cure. The finished plate is then mounted on a cylinder of a printing press by either laminating a compressible layer to the back of the finished plate and then adhering it to the printing cylinder or adhering a layer of compressible tape to the printing cylinder and subsequently adhering the back of the printing plate to this compressible layer. If the compressible layer has a support layer the support layer is preferentially located in contact with the backing of the plate to avoid buckling. Alternatively, the substrate 22 could be removed from the photopolymerized composition if manufactured with a non-adhesive coated substrate and laminated directly to the compressible layer but this approach results in loss of dimensional stability. Adhesion is accomplished in every case through the use of an adhesive, a tape or a tie layer.

According to the inventive process, a printing plate comprising a photopolymer layer and a compressible layer can be prepared having no adhesive or tie layer therebetween. Plates prepared according to the inventive process thus avoid the problems associated with using an adhesive, a tape or a tie layer to adhere the photopolymer layer to the compressible layer, as discussed previously.

According to the inventive process, a compressible layer is coated with at least one layer of a liquid photopolymerizable resin, and the resin is incompletely cured by exposure to actinic radiation: the cure is incomplete in that the top surface of the floor layer should be substantially uncured while the bottom region of the floor layer, i.e., the region closest to the compressible layer, should be substantially cured. This forms a floor layer of a photopolymer layer in direct contact with the compressible layer. A second layer of liquid photopolymerizable resin is then placed on the incompletely cured resin that forms the floor layer. A transparency having opaque regions is disposed between a source of actinic radiation and the second layer, and the second layer is exposed to actinic radiation so as to achieve a partial cure of the second layer. The cure is partial in that only those regions of the relief layer that are contacted by actinic radiation become cured while remaining regions are substantially uncured. Substantially uncured resin contained in the remaining regions are washed away with a developer solution, so that a laminate comprising a compressible layer and a photopolymer layer, where the photopolymer layer comprises a relief layer and a floor layer, and the floor layer is in direct contact with the compressible layer, is thereby produced.

Figure 2:
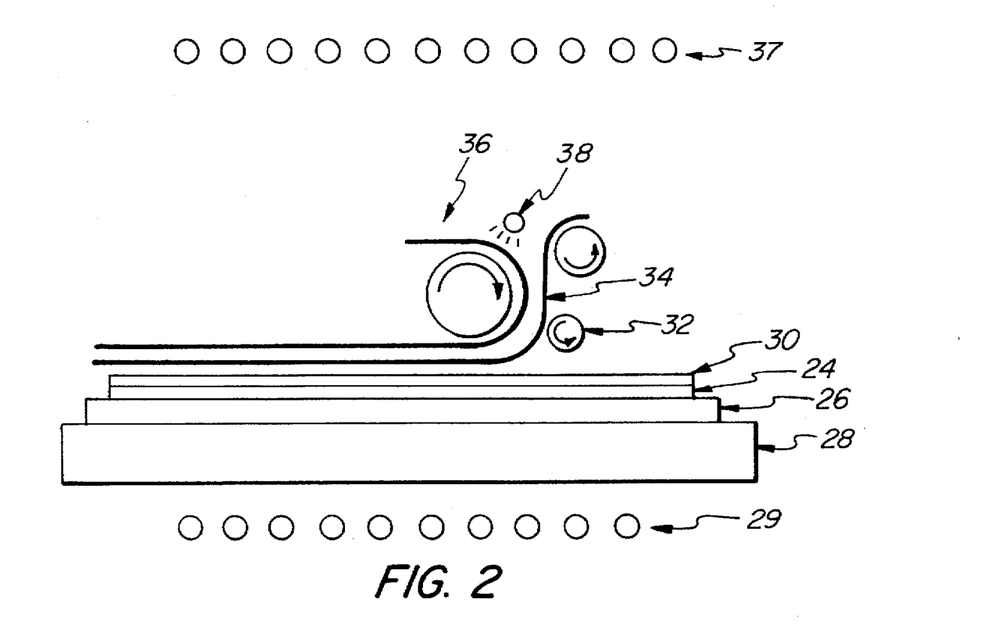
FIG. 2 is a diagrammatic illustration of a printing plate manufacturing process according to the invention.

A preferred embodiment of the inventive process can be illustrated by reference to FIG. 2. In FIG. 2, a first layer of liquid photopolymerizable resin 24 is cast directly onto a compressible layer 26, where the compressible layer 26 is positioned on a lower glass platen 28. The first layer of liquid photopolymerizable layer 24 is exposed to first actinic radiation from a radiation source 29 and/or 37 to provide incompletely cured first photopolymerizable layer 24 (floor layer, as discussed below). A second layer of liquid photopolymerizable resin 30 (relief layer, as discussed below) is cast directly on the incompletely cured first photopolymerizable resin 24. Then a laminating roll 32 is used to position a coverfilm 34 on the photopolymerizable resin layer 30, while simultaneously placing an image-bearing transparency 36, optionally coated with an adhesive delivered from a spray bar 38 on the coverfilm 34. The adhesive is present to adhere the image bearing transparency to the coverfilm. The plate is then formed via a single-sided exposure of actinic radiation from source 37 directed through the transparency 36.

The compressible layer 26 can be formed from any material that (a) may be compressed and will spring back to substantially its original shape once the compressive force is removed, and (b) has a surface with an open cell structure into which fluid may flow and collect. Sponges and foams are exemplary compressible materials according to the invention. Typical foams which can be used are polyurethane foams, polyolefin foams, polyvinyl chloride foams, rubber foams, and the like. The foams can be chemically blown or mechanically frothed with any gas, including air, which will not interfere with the process of this invention nor substantially detract from the desired properties of the foam. A sponge, such as natural sponge, may also be used.

The interior of the compressible layer 26 may have either an open (also known as continuous) or closed-cell structure, however the surface of the compressible layer is necessarily open cell. A closed-cell structure for the interior of the compressible layer is preferred for the following reasons. If the interior is open-cell, then application of a liquid photopolymerizable resin coating will typically result in uneven penetration of the resin into the compressible layer. Uneven penetration is disadvantageous because, upon curing the penetrated photopolymerizable resin, those regions of the compressible layer with greater penetration of cured, i.e., hardened resin, will tend to have less compressibility than regions having less resin penetration. Uniform compressibility of the compressible layer is desirable in order to maximize printing performance of a printing plate made therefrom.

Another disadvantage of an open-cell structure for the interior of the compressible layer is that it tends to absorb more photopolymerizable resin than is necessary to achieve a good bond between the resin and the compressible layer, thus effectively wasting resin. Furthermore, photopolymerizable resin that penetrates deeply into the compressible layer may be difficult to cure by exposure to actinic radiation. Another disadvantage of an open-cell structure is that it tends to absorb more ink than a closed-cell structure, and ink absorption by the compressible layer is not advantageous, and can be disadvantageous, during printing operations. Thus, while careful design of an open-cell structure may overcome some or all of the above-stated disadvantages, closed-cell structures preferably having a uniform distribution of uniform cell size, are readily available and work quite well in the invention.

Preferably, the cells of the closed-cell structure are of nearly uniform size or, if of variable size, the variably sized cells are uniformly distributed throughout the compressible layer. A cell size of about 1 mil to about 20 mil in diameter is preferred. The density of the compressible layer, absent penetrating photopolymerizable resin, is preferably about 10 lbs/ft$^3$ to about 50 lbs/ft$^3$, and more preferably about 15 lbs/ft$^3$ to about 40 lbs/ft$^3$. Closed cell structures having the foregoing properties may be referred to as microcellular foams.

The compressible layer preferably has a thickness of about 10 mil to about 220 mil, and more preferably of about 150 mil to about 180 mil. The top and bottom surfaces of the compressible layer are preferably substantially flat and parallel to one another. Thus, the thickness deviation of the compressible layer is preferably less than about 5 mil, where thickness deviation is the difference between the layer thickness as measured at the compressible layer's thinnest and thickest points. More preferably, the thickness deviation is less than about 2 mil.

While the surfaces of the compressible layer are preferably flat, that is not to say the surfaces are completely smooth or even. Preferably, the surface intended for contact with the photopolymerizable resin is uneven, that is, it contains nooks and crannies in which liquid photopolymerizable resin may be collected. In a preferred embodiment, the compressible material is a foam with a closed cell interior and a ground surface at that surface in contact with the photopolymerizable resin. Grinding may be used to make the surface flat and also break open the closed cells nearest a surface so that surface has open cells. Such ground foams are commercially available from, for example, the PORON Materials Division of Rogers Corporation, East Woodstock, Conn. 06244.

In general, any of the compressible backing sheets currently used in the printing industry to supply a compressible backing to a photopolymer layer having a relief image, may be used according to the invention. The compressible layer may be opaque, or fully or partially transparent or translucent to actinic radiation.

Prior to being mounted onto a printing press, the compressible layer should be adhered to a dimensionally stable layer. The dimensionally stable layer will directly face the cylinder used in the printing process. The dimensionally stable layer is preferably adhered to the compressible layer prior to combining photopolymerizable resin with the compressible layer, however, joining a dimensionally stable layer to a compressible layer can be done at any time prior to mounting the plate on the printing press. A laminate of compressible layer and layers of cured photopolymerizable resin thus serves as an intermediate to a plate which can be mounted onto a printing press.

The dimensionally stable layer is not susceptible to substantial deformation when one attempts to pull two ends of the layer away from each other. In other words, the dimensionally stable layer does not have any substantial stretching character, although it can be bent by virtue of its having a small thickness and relatively larger length and width. The dimensionally stable layer may have a thickness of about 2 mil to about 15 mil, and preferably has a thickness of about 5 mil to about 10 mil.

Suitable dimensionally stable layers may comprise polymeric materials, where exemplary, non-limiting examples of such polymeric materials include polystyrene, polyvinyl chloride, polyvinyl acetate and polyester. Preferably, the polymeric material is a polyester film such as Mylar® film. Alternatively, or additionally, the dimensionally stable material may comprise metal, where suitable metals include steel, aluminum, magnesium, copper, chromium, alloys thereof and the like. The dimensionally stable layer may additionally comprise a cellulosic, such paper or paperboard. The dimensionally stable layer may be opaque, such as where the dimensionally stable layer is formed of metal, or transparent or translucent, such as where the dimensionally stable layer is formed of Mylar® film.

The compressible layer may be adhered to the dimensionally stable layer by any one of several methods. A suitable method to provide a compressible layer—dimensionally stable layer laminate is to cast foam onto a dimensionally stable layer, where the foam forms the compressible layer. Casting of a foam onto a dimensionally stable layer is described in U.S. Pat. 4,582,777, the entire disclosure of which is hereby incorporated herein by reference. Alternatively, an adhesive may be placed between the compressible layer and the dimensionally stable layer. Suitable adhesives include, but are not limited to, cyanoacrylates, epoxies, urethanes, hot melt adhesives, etc.

According to a preferred embodiment of the invention, a laminate formed of a layer of Mylar® and a layer of closed cell microcellular foam having open cells only at one surface, is placed into a commercially available apparatus designed for photopolymer plate manufacture. Merigraph® photopolymer plate manufacturing units (Hercules Incorporated, Wilmington, Del.) are well suited to the inventive method. A Mylar® sheet is preferably placed on the bottom of a plate-forming chamber of the Merigraph® unit, with a compressible layer on the Mylar® sheet so that the open cell surface of the compressible layer faces up and can receive a coating of photopolymerizable resin.

According to the invention, a layer or layers, denoted herein collectively as the floor layer 24 and comprising photopolymerizable resin, is placed adjacent to, and in contact with, the compressible layer 26. The compressible layer is in direct contact with photopolymerizable resin of the floor layer, i.e., there is neither a tie coat layer nor a dimensionally stable layer positioned between the compressible layer and the floor layer. The photopolymerizable resin directly contacts and penetrates the compressible layer, with no intermediate layer of any kind.

Figure 3:
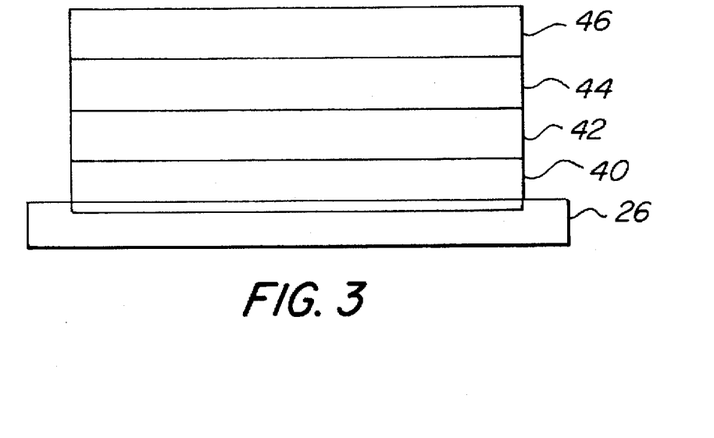
FIG. 3 is a partial cross-sectional schematic view of part of a printing plate produced by the inventive process, prior to developing.

FIG. 3 illustrates a partial cross-sectional view through part of a preferred printing plate of the present invention. In FIG. 3, a compressible layer 26 is in direct contact with a layer 40 of polymerized photopolymerizable resin, where layer 40 is in direct contact with a layer 42 of polymerized photopolymerizable layer, and where layers 40 and 42 comprise the floor layer 24 of the plate. In FIG. 3, layer 40 is shown to extend both above and below the top surface of the compressible layer 26, in order to reinforce the point that the photopolymerizable resin of layer 40 should penetrate into the compressible layer 26.

It should be understood that subsequent layers of photopolymerised photopolymerizable resin, not shown in FIG. 3, could be stacked on top of layer 42, so that the floor layer 24 could constitute three, four, five or more layers of polymerized photopolymerizable resin. The composition of the photopolymerizable resin of layer 40 may be the same or different from the composition of the photopolymerizable resin of any other layer that forms the photopolymer plate. Likewise, the composition of the photopolymerizable resins of layers 42, etc. may be the same or different from the composition of any other layer of photopolymerizable resin in the final photopolymer plate.

While there is really no limit to the number of resin layers which may comprise the floor layer, a single layer of photopolymerizable resin is often adequate to provide a useful floor layer, and a preferred embodiment of the invention uses a single layer of photopolymerizable resin to form the floor layer 24. In another preferred embodiment of the invention, the floor layer is formed of two layers, each comprising photopolymerizable resin. It should be noted that while the floor layer will initially comprise photopolymerizable resin, which is uncured, the floor layer is ultimately exposed to actinic radiation according to the invention, and after said exposure the floor layer will comprise cured, i.e., polymerized, photopolymerizable resin.

Each layer of photopolymerizable resin which comprises the floor layer is preferably applied onto the underlying layer by a coating or casting process. Commercially available equipment for making photopolymer plates generally come equipped with a means to meter liquid photopolymerizable resin, as a uniform layer of selected thickness, onto an underlying layer. For example, selected Merigraph® units come equipped with a "capping blade", which may be set to apply a selected thickness of liquid photopolymerizable resin onto a surface having a specified width and length. Alternatively, one can simply pour the photopolymerizable resin onto a surface, and use a blade to smooth out the resin. One may also spray the resin onto a surface, however photopolymerizable resins are generally viscous, and not easy to spray.

In order to prepare a printing plate that retains a stable connection between the compressible layer and the floor layer during printing operations and storage between printing operations, it is desirable to have the floor layer penetrate into the compressible layer. After casting a layer of photopolymerizable resin onto a compressible layer, there is generally air entrapped between the compressible layer and the layer of resin. With enough time, gravity will ensure that the air is displaced by resin. However, to hasten the displacement of the air, it is preferred to use mechanical force to forcefully press the photopolymerizable resin into the compressible layer.

According to a preferred embodiment of the invention, the compressible layer has a substantially closed cell structure, with open cells substantially present only at the surface of the compressible layer in contact with the photopolymerizable resin. In order to force the photopolymerizable resin of the floor layer into the open cells of the compressible layer, one may wipe the blade of a knife across the resin layer while applying force downward so that resin is pushed into the open cells. As an alternative, one can employ a series of blades, joined together in parallel fashion so they are a fixed distance apart, and then pass such an arrangement of blades across the surface of the compressible layer having a coating of photopolymerizable resin thereon.

According to a preferred embodiment for forcing photopolymerizable resin into the open cells of a compressible layer, a transparent layer of film, e.g., a coverfilm, is placed atop at least layer 40, and optionally one or more layers of photopolymerizable resin that are on top of layer 40 and that comprise the floor layer 24. The coverfilm is longer and wider than the compressible layer having resin coated thereon, and the edges of the film which extend past the compressible layer are positioned over a vacuum source. When vacuum is applied, the coverfilm is pulled firmly downward, thus displacing air from the open cells on the surface of the compressible layer with photopolymerizable resin. After applying vacuum for about 10 to about 15 minutes, the photopolymerizable resin under the film appears clear, i.e., is not full of bubbles. When this appearance is observed, the open cells on the surface of the compressible layer are substantially filled with photopolymerizable resin, and further vacuum is unnecessary. The coverfilm is then removed. Selected Merigraph® units come equipped with such a vacuum source, and thus may be employed to force resin into the surface of a compressible layer, according to the foregoing preferred embodiment of the invention.

After at least layer 40, and optionally layers 42, etc. have been placed on the compressible layer, and resin forced into the open cells of the compressible layer, then one or more additional layers of photopolymerizable resin may be placed on top of the previously positioned layers of photopolymerizable resin. For example, and according to a preferred embodiment of the invention, layer 40 of photopolymerizable resin is coated or cast onto the compressible layer, mechanically forced into the open cells of the compressible layer, and then layer 42 is coated onto layer 40.

First actinic radiation may be directed to the floor layer at any time subsequent to photopolymerizable resin of the floor layer being coated onto, and filling the open cells of, the compressible layer. That is, after any layer, such as layer 40, layer 42, etc., is placed over the compressible layer, and photopolymerizable resin fills the open cells of the compressible layer, the layer or layers of photopolymerizable resin may be exposed to first actinic radiation. However, exposure of resin to the first actinic radiation should not result in a complete curing of the radiation-exposed photopolymerizable resin of the floor layer. In particular, that surface of the floor layer which is not in contact with the compressible layer, and is exposed to air, i.e., the top (as viewed in FIGS. 2 and 3) surface of the floor layer, should not be allowed to achieve a complete cure. After exposure to first actinic radiation, the top surface should be somewhat fluid, and perhaps sticky, and not totally cured.

According to the invention, it is necessary to expose the floor layer to actinic radiation at some point during formation of the floor layer, in order to achieve at least a partial cure of the photopolymerizable resin that is in direct contact with the compressible layer. Preferably, this exposure to actinic radiation achieves a complete cure of the resin nearest, and in contact with, the compressible layer. It is believed that the presence of cured photopolymerizable resin in and around the open cells of the compressible layer provides a mechanical bond between the compressible layer and the floor layer, and this mechanical bond is responsible for a substantial part, if not all, of the bonding strength which ultimately develops between the floor layer and the compressible layer.

It is preferred that no material having oxygen barrier properties should be placed on top of the floor layer during exposure of the floor layer to first actinic radiation. It has been observed that if the top surface of the floor layer is allowed to contact oxygen during the time it is exposed to first actinic radiation, then the top surface of the floor layer will not completely cure. Contact with oxygen inhibits complete curing of the preferred photopolymerizable resins used to prepare the photopolymer layer of the invention.

It is important that the top surface of the floor layer not be allowed to prematurely become totally cured. Thus, the inventive method requires that a subsequent layer of photopolymerizable resin will be placed on the top surface of the floor layer, with the expectation that some mingling of the resin in the incompletely cured top surface of the floor layer, and resin in the subsequently placed layer of photopolymerizable resin, will occur, to thereby provide an intermediate layer formed of the mingled or blended resins. The intermediate layer is not explicitly shown in FIG. 3, however is present at the interface of layers 40 and 42. If a complete curing of the top surface of the floor layer is permitted, then subsequently applied layer(s) of photopolymerizable resin will be less able to penetrate the top surface, and a strong bond between the top surface of the floor layer and subsequent layer(s) of photopolymerizable resin will be less likely to form.

In the first actinic radiation exposure step, actinic radiation may be directed towards the floor layer from either the front or back of the forming plate. The back of the forming plate is defined as that side of the compressible layer furthest from the floor layer, i.e., the bottom in FIG. 2. The front side of the forming plate is that side of the floor layer furthest from the compressible layer, i.e., the top in FIG. 2. Thus, according to back exposure, and if the compressible layer, and dimensionally stable layer if present, are at least partially transparent to first actinic radiation exposure, the floor layer is exposed to first actinic radiation from source 29, which is directed through the compressible layer and into the floor layer. Alternatively, or additionally, front exposure may be employed, wherein the floor layer is exposed to first actinic radiation from source 37.

Referring back to FIG. 3 according to one embodiment of the invention, layer 40 of photopolymerizable resin is applied to the compressible layer, a transparent film (not shown) is placed atop layer 40, vacuum is applied to force the film towards the compressible layer and cause resin to displace air from the open cells of the compressible layer, the film is removed and the layer 40 is exposed to first actinic radiation. This provides a sticky top surface to layer 40, and a substantially cured bottom surface in contact with the compressible layer.

According to another embodiment of the invention, layer 40 of photopolymerizable resin is applied to the compressible layer, a transparent film is placed atop layer 40, vacuum is applied to force the film towards the compressible layer and cause resin to displace air from the open cells of the compressible layer, the film is removed, layer 42 of photopolymerizable resin is applied onto layer 40, and the layers 40 and 42 are exposed to first actinic radiation from sources 37 and/or 29, as shown in FIG. 2. This provides a sticky top surface to layer 42, and a substantially cured bottom surface of layer 40 in contact with the compressible layer.

As the first actinic radiation desirably causes a complete curing of the photopolymerizable resin in direct contact with the compressible layer, it is preferable that the first actinic radiation not be directed through an image-bearing transparency. The exact quality and quantity of the actinic radiation to be employed will depend on the identity of the photopolymerizable resin being cured, as well as the thickness of the photopolymerizable resin layer(s) and, if back exposure is used, the identity and thickness of the compressible layer and, possibly, the dimensionally stable layer. However, in general, first actinic radiation having wavelengths in the range of about 200 to about 500 nanometers and preferably about 300 to about 400 nanometers, with an intensity of about 1 to about 20 milliwatts per square centimeter, may be used. A typical commercial exposure unit that can be used in the process of this invention is a Merigraph® 3048 exposure unit, (Hercules Incorporated, Wilmington, Del.). An exposure time of 1–3 minutes is generally suitable.

While the floor layer may be exposed to first actinic radiation one or more times after any layer of photopolymerizable resin is applied onto or over the compressible layer, after the last layer of photopolymerizable resin that will form the floor layer has been cast, first actinic radiation exposure should be directed to the floor layer. In this way, the floor layer becomes substantially cured throughout, except at the top surface which should remain incompletely cured.

Referring again to FIG. 2 after formation of the floor layer 24, at least one additional layer of photopolymerizable layer is placed over the floor layer, where the additional layer(s) comprise the relief layer 30 of the photopolymer plate. Thus, in reference to FIG. 3, the relief layer 30 will comprise at least one layer of photopolymerizable resin, called layer 44, that will be in direct contact with the top surface of the floor layer, shown as layer 42 in FIG. 3. An additional layer of photopolymerizable layer, called layer 46, may be applied on top of layer 44. Subsequent layers of photopolymerizable resin, not shown in FIG. 3, may be placed on top of layer 46 to complete formation of the relief layer 30. According to one embodiment of the invention, the relief layer comprises only a single layer of photopolymerizable resin. According to another embodiment of the invention, the relief layer comprises only two layers of photopolymerizable resin.

After the layer or layers of photopolymerizable resin that comprise the relief layer have been positioned, either by coating, casting or spraying, the relief layer is exposed to second actinic radiation. The second actinic radiation, as from a source 37 as shown in FIG. 2, is directed through an image-bearing transparency, having both transparent and opaque regions, also called a negative or a negative transparency. Actinic radiation passes only through the transparent regions of the image-bearing transparency, and then impinges on the relief layer of photopolymerizable resin(s) to form an image corresponding to that of the image-bearing transparency. The exposure of photopolymerizable resin to actinic radiation in order to impart a relief image to the resin is well known in the art, and standard methodology as described in the art may be employed in the instant invention.

As with the first actinic radiation exposure, one or both of front or back exposure may be used in directing second actinic radiation towards the relief layer. It is necessarily true, however, that at least some of the second actinic radiation passes through a negative or transparency, in order to impart the relief image to the photopolymerizable layer. Thus, in reference to FIG. 2, at least some of the second actinic radiation exposure would come from the source 37 of actinic radiation. The quality and quantity of the second actinic radiation exposure must be chosen in view of the identity and thickness of the relief layer. However, in general, second actinic radiation having wavelengths in the range of about 200 to about 500 nanometers, and preferably about 300 to about 400 nanometers, with an intensity of about 1 to about 20 milliwatts per square centimeter may be used. A typical commercial exposure unit that can be used to impart a relief image to one or more layers of photopolymerizable resin is a Merigraph® 3048 exposure unit, (Hercules Incorporated, Wilmington, Del.). An exposure time of 10–20 minutes is generally suitable.

It should be mentioned that, unlike during resin exposure to the first actinic radiation, oxygen is preferably excluded from the surface of the relief layer when the relief layer is exposed to the second actinic radiation. It is desirable to exclude oxygen from the top surface of the relief layer, so that the entire relief layer, including the top surface, will become cured in those regions exposed to second actinic radiation. Thus, prior to exposure to second actinic radiation, a transparent protective layer may be placed on top of the relief layer, and then the image-bearing transparency placed on top of the protective layer. If the protective layer is omitted, the image-bearing transparency may stick to the relief layer after exposure to second actinic radiation. The protective layer, which desirably has good release properties, thus protects the image-bearing transparency from adhering to the relief layer.

The transparent protective layer which separates the image-bearing transparency from the photopolymerizable resin of the relief layer can be any transparent film or film-forming material that will not adhere to the relief layer after exposure to actinic light, and specifically includes materials that dissolve in an aqueous developer.

The transparent protective layer may be a so-called coverfilm, which is well-known in the art. Typical films that may be used as coverfilms in the process of this invention are polypropylene, polyethylene, polyester, cellulose acetate and polystyrene. The thickness of the coverfilm is not critical, however coverfilms having a thickness of about 0.25 mil to about 2.5 mil, and preferably less than about 1 mil, and most preferably less than about 0.5 mil, are well suited for the inventive process.

The protective layer may also be a release composition that may be coated directly onto the image-bearing transparency. A preferred release composition for this purpose comprises a film forming material, preferably at a concentration of about 0.5% to about 8%, where suitable film-forming materials include, without limitation, nitrocellulose, ethyl cellulose, polysilicate,polyvinyl acetate and other materials described in, e.g., U.S. Pat. No. 4,247,576 as film-forming materials. The disclosure of U.S. Pat. No. 4,247,576 is incorporated by reference herein. The release composition also comprises lecithin, preferably at a concentration of about 0.05% to about 5%, wax, preferably at a concentration of about 0.01% to about 1%, and an organic solvent, preferably at a concentration of about 90.5% to about 99.4%. The percentages given above are by weight and are based on the total weight of the release composition.

A preferred release composition useful as a protective layer, i.e., a layer which provides a barrier to adhesion between the image-bearing transparency and the photopolymerizable resin, comprises about 2% Nitrocellulose RS, ½ sec (Hercules Incorporated, Wilmington, Del.) and about 0.2% lecithin. Lecithin, also known as phosphatidylchloine, is a well-known material available from many commercial supply houses, including Sigma Chemical Company, St. Louis, Mo., and W.A. Cleary Co., Somerset, N.J. The wax in the preferred release composition provides lubrication properties, and preferably has a melting point above about room temperature, but less than about 60° C. Synthetic spermaceti and modified fatty acid are preferred waxes. Synthetic spermaceti is available from, e.g., Koster Keunen, Incorporated, Watertown, Conn. Modified fatty acid is available from, e.g., Mona Industrials, Incorporated, Patterson, N.J., as Mona-wet MO-70.

In a preferred release composition, nitrocellulose is at a concentration of about 4%, lecithin is at a concentration of about 0.2%, synthetic spermaceti is present at a concentration of about 0.5% and butyl acetate is the solvent, present at a concentration of about 95%.

The release composition may be coated directly onto an image-bearing transparency, preferably the emulsion side thereof. Upon placing the coated transparency onto the relief layer that comprises photopolymerization resin, and then partially curing the resin by exposure to actinic radiation, the release composition allows for the ready release of the image-bearing transparency from the partially cured resin. In the absence of the coating, the image-bearing transparency may adhere to the partially cured resin, and the forced removal of the image-bearing transparency from the partially cured resin may damage the surface of the partially cured resin.

After subjecting the relief layer to second actinic radiation exposure, and removing the image-bearing transparency and, if present, the coverfilm, the relief layer is contacted with a developer solution. The developer solution provides for the emulsification or solubilization, and thus removal, of photopolymerizable resin that was not exposed to second actinic radiation, i.e., the removal of uncured photopolymerizable resin. Left behind will be photopolymerizable resin that was exposed, and thus cured by, second actinic radiation exposure, and that forms the image of the relief layer of the photopolymer layer.

Several different methods may be used to develop the relief layer. For example, uncured photopolymerizable resin can be washed away, or it can be blown away using an air knife, or it can be blotted away or squeegeed away. A combination of two or more of the above-mentioned methods can be used. Preferably, the uncured photopolymerizable resin will be washed emulsified or dissolved away using one of the commercial developer units available, for example, from Hercules Incorporated (Wilmington, Del.).

Any commercial developer unit that employs developer solution can be used to develop the relief layers prepared according to the method of this invention. The specific solution used will depend upon the specific photopolymerizable resin used to make the photopolymer layer, and will be obvious to those skilled in the art. Generally, an aqueous alkaline solution may be used. It may also be desirable to employ a small amount of detergent or surface active agent in the aqueous developing solution.

Following development, the photopolymer layer may be "post-exposed" to actinic radiation, i.e., subjected to a third actinic radiation exposure, which may be of the same or different quality and quantity as the first and second actinic radiation exposures. Subjecting the plate to a third actinic radiation exposure may provide a more complete cure for the photopolymer layer of the invention, and thus a more durable printing plate.

The photopolymerizable resin according to the invention may be any material which is both fluid when uncured, and hardens upon exposure to selective wavelengths of actinic radiation. Such resins are very commonly used in the photopolymer printing plate making industry, and thus are well known to those skilled in that art. The inventive method provides that one or more different photopolymerizable resins, or resin compositions, may be employed in the preparation of the image-bearing laminate.

Any of the well-known liquid photopolymerizable compositions used to prepare flexographic printing plates can be used in the process of this invention. For example. U.S. Pat. No. 3,794,494 to Kai et al. discloses liquid photopolymerizable compositions containing an unsaturated polyester, an ethylenically unsaturated monomer and a photopolymerization initiator, which can be used as a photopolymerizable resin in the process of this invention. The entire disclosure of U.S. Pat. No. 3,794,494 is incorporated by reference herein.

Other examples of liquid photopolymerizable resins that can be used in the process of this invention are disclosed in U.S. Pat. No. 3,960,572 to Ibata et al. The Ibata et al. compositions comprise polyester-polyether block polymers that are useful in the process of this invention. The entire disclosure of U.S. Pat. No. 3,960,572 is incorporated by reference herein. Yet another example of liquid photopolymerizable resins that can be used in the process of this invention is disclosed in U.S. Pat. No. 4,442,302 to Pohl. The Pohl compositions comprise a chain extended, terminally olefinically unsaturated polymer, at least one ethylenically unsaturated monomer and photoinitiator. The disclosure of U.S. Pat. No. 4,442,302 is incorporated by reference herein. It will be obvious to those skilled in the art that many other photopolymerizable compositions can be used in the process of this invention.

According to a preferred embodiment, the photopolymerizable resin that comprises the floor layer 24 has a higher, or enhanced UV absorbency compared with the photopolymerizable resin that comprises the relief layer 30. UV absorbency refers to the quantity of UV radiation that will be absorbed by a given quantity or thickness of resin, so that a resin having a greater UV absorbency will absorb a greater percentage of impinging UV radiation. This is advantageous for several reasons. First, the photopolymerizable resin layer 40 of the floor layer, which penetrates into the compressible layer, may not receive full exposure to the first actinic radiation exposure, especially if the compressible layer and/or dimensionally stable layer are opaque or partially opaque to first actinic radiation. A photopolymerizable resin with an enhanced UV absorbency will cure more readily with less exposure to the actinic radiation. Second, complete curing of the topmost resin of the floor layer does not occur until it is exposed to the second actinic radiation. As this topmost resin is sandwiched between the photopolymerizable resin of the relief layer, and the compressible layer, the topmost resin of the floor layer is somewhat shielded from the second actinic radiation. By providing the topmost resin of the floor layer with an enhanced UV absorbency, that topmost resin has an increased likelihood of absorbing curing radiation and thus becoming fully cured. Third, the higher absorbency of the floor layer will act as an antihalation layer during the main exposure reducing the tendency to fill in reverse printing elements.

Methodology to regulate the UV absorbency of photopolymerizable resins is well known in the art. Typically, one can add UV absorbent materials to the photopolymerizable resin to enhance the UV absorbency of the resin. Typical UV absorbent materials that may be employed for this purpose include, without limitation, benzoin isobutyl ether, dimethoxyphenylacetophenone, benzoin isopropyl ether, benzophenone, 2,2-diethoxyacetophenone and the like.

The photopolymerizable resin that is selected for any one layer of the image-bearing laminate of the invention may be selected based on the moduli of the cured resin. Thus, according to one embodiment of the invention, the cured photopolymerizable resin of layer 40 may have a higher hardness, as measured by a durometer, than the cured photopolymerizable resin of layer 42. Likewise, the layers 44, 46, etc. in the relief layer may have moduli that are the same or different from one another, and from the moduli of any of the layers 40, 42, etc. present in the floor layer. For example, a printing plate according to the invention may have a harder relief layer with a softer floor layer or vice versa. For example, U.S. Pat. No. 4,266,007 to Hughes et al., and U.S. Pat. No. 4,332,873 to Hughes et al. both disclose multilayer printing plates formed of photopolymerizable resins, where the different layers have moduli differing by at least about 50 psi. The resins, and sequence of resins, as disclosed by either of the Hughes et al. patents, may be used according to the present invention. The entire disclosures of U.S. Pat. No. 4,226,007 and 4,332,873 are incorporated herein by reference.

It may also be desirable that individual layers of photopolymerizable resin yield cured resin having equivalent hardness, but the uncured resins have different photospeeds. Such multilayer plates can readily be made using the process of this invention.

Figure 4:
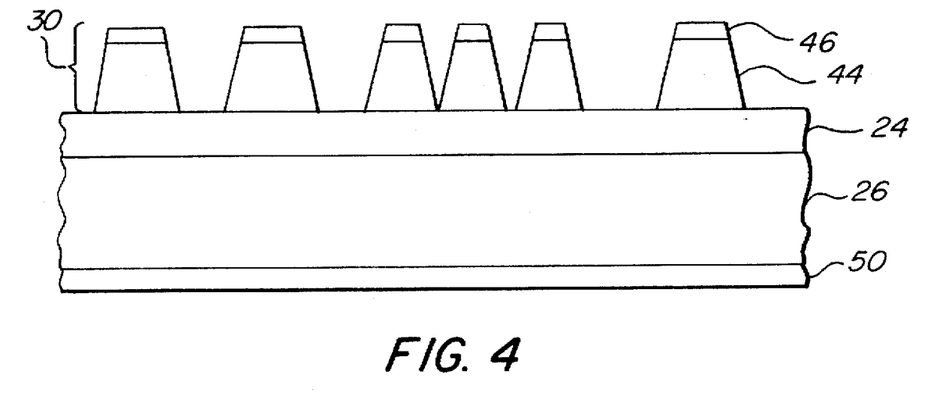
FIG. 4 is a partial cross-sectional schematic view of a second printing plate produced by the inventive process, after developing.

FIG. 4 illustrates a partial cross-sectional view through a printing plate of the present invention. In FIG. 4, a dimensionally stable layer 50, preferably made from Mylar® film, is adhered to a compressible layer 26, preferably a microcellular foam, where suitable adhesive methods were described above. Directly adjacent to the compressible layer 26 is a floor layer 24 comprising a single layer of cured photopolymerizable resin. There is no tie layer or adhesive present between the compressible layer 26 and the adjacent cured photopolymerizable resin of floor layer 24. On top of the floor layer 24 is a relief layer 30, also formed of cured photopolymerizable resin. The relief layer 30 is seen to have peaks and valleys, which will be present after the cured resin 30 has been developed. The relief layer 30 has a layer 44 in direct contact with the floor layer 24, and a relatively thin topmost layer 46, which by virtue of it being the topmost layer may also be referred to as a capping layer.

Printing plates of varying thicknesses can be prepared using the process of this invention. In general, the printing plates will have a total thickness of about 45 mil to about 285 mil. The relief layer 30 will have a thickness of about 15 mil to about 200 mil, preferably about 35 mil to about 100 mil. The floor layer 24 will have a thickness of about 5 to about 100 mil, preferably about 10 to about 20 mil. The total of the photopolymerizable resin layers have a thickness of about 30 mil to about 300 mil. The compressible layer 26 will have a thickness of about 10 mil to about 220 mil, preferably about 20 mil to about 180 mil. The dimensionally stable layer 50 will have a thickness of about 2 mil to about 15 mil, preferably about 5 mil to about 10 mil.

According to the invention, photopolymer printing plates can be prepared for corrugated box board printing, that eliminate the need for individual plate mounting that is the common practice now employed industrially. The plates of the invention provide excellent impression latitude. The process of the invention is particularly suited for the preparation of flexographic printing plates.

The invention will now be illustrated by the following non-limiting examples, which demonstrate the advantageous properties of the present invention. Parts and percentages are by weight unless indicated otherwise.

EXAMPLE 1

A protective layer of Mylar® film was placed on the lower glass platen of a Merigraph® 3048 exposure unit (Hercules Incorporated, Wilmington, Del.) cut to fit inside the vacuum grooves. A compressible layer, (Rogers R-Bak SF 180, Rogers Corporation, PORON Materials Division, East Woodstock, Conn.) having a dimensionally stable layer affixed thereto as provided by the manufacturer, was fixed flat to the protective film with double-sided tape. The compressible layer had dimensions of 23" by 40" by 0.18".

A capping blade was set for 10 mil, and a first layer of photopolymerizable resin F240 (Hercules Incorporated, Wilmington, Del.) having 1.33 weight percent dimethoxyphenylacetophenone (DMPAP) was spread over the compressible layer. EK-500 (Hercules Incorporated, Wilmington, Del.), a 75-gauge, transparent, polypropylene coverfilm, was spread over the top of the resin and vacuum-applied to force resin into open cells on the surface of the foam. After the surface appearance became clear (10–15 minutes), the coverfilm was removed and a 20 mil thickness intermediate layer of photopolymerizable resin (F240 resin) was doctored onto the resin coated/impregnated-compressible material.

The twice-coated layer was then exposed to first actinic radiation at about 5 mW/cm$^2$ for two minutes, in the absence of a coverfilm over the intermediate photopolymerizable resin layer. The exposure resulted in a partially cured layer of photopolymerizable resin, having a sticky surface.

The coated, partially cured layer of photopolymerizable resin on the compressible layer, was transferred to the lower glass platen of a 2228 Merigraph® exposure unit (Hercules Incorporated, Wilmington, Del.) and positioned so as to cover the vacuum grooves. Vacuum was applied to hold the coated layer flat. A second photopolymerizable resin layer, specifically photopolymerizable resin F035 (Hercules Incorporated, Wilmington, Del.) containing 0.3% DMPAP, and thus comprising a lower initiator concentration than present in either the first or intermediate photopolymerizable resin layers, was cast onto the layer using a bucket system on the 2228 unit.

An image-bearing photographic transparency, protected by a 48-gauge polypropylene coverfilm that had been prelaminated to the image-bearing transparency using 3M Spray Mount™ artist's adhesive, was then placed on top of the second photopolymerizable resin layer. Second actinic radiation having a light intensity of 11 mW/cm$^2$ was directed for 15 minutes through the image-bearing transparency and into the layers of photopolymerizable resin.

The plate was removed from the 2228 unit and developed in a Flatbed Merigraph® system washout unit (Hercules Incorporated, Wilmington, Del.) for 15 minutes using EPD 1695 developer (Hercules Incorporated, Wilmington, Del.) at 90° F. and 55 psi pressure. The resulting plate was post-exposed in a Merigraph® System Post Ex unit (Hercules Incorporated, Wilmington, Del.) for 30 minutes with exposure to third actinic radiation at 8.5 mW/cm$^2$. The resulting plate was dried using forced air at a temperature of 90° F.

The finished image-bearing laminate was 280 mil thick with 80 mil relief, and had the desired image. Adhesion between the layer and the cured photopolymer resins was excellent.

EXAMPLE 2

A protective layer of film was placed on the lower glass platen of a Merigraph® 3048 exposure unit (Hercules Incorporated, Wilmington, Del.) after having been pre-cut to fit inside the vacuum grooves. The back face of a sheet of compressible layer, where the compressible layer is 118 mil thick Rogers R-Bak 4709-01-20 (Rogers Corporation, PORON Materials Division, East Woodstock, Conn.), was secured flat to the protective film with double-sided tape. A capping blade was set for 10 mil and a coating of F035 photopolymerizable resin (Hercules Incorporated, Wilmington, Del.) was spread over the front face of the compressible layer. A 75-gauge, polypropylene, transparent coverfilm was laid over the top of the resin and vacuum was applied to the coverfilm in order to force photopolymerizable resin into open cells on the surface of the compressible layer.

After the appearance of the cover film-entrapped resin became clear (10–15 minutes), the coverfilm was removed and a 20-mil layer of F035 photopolymerizable resin was applied. This was then exposed for 90 seconds at 5 mW/cm$^2$ using the light source on the Merigraph® system 3048 unit to provide an exposed resin+compressible layer product.

The exposed resin+compressible layer was removed from the 3048 Merigraph® exposure unit, and a Hilux™ negative, (Hercules Incorporated, Wilmington, Del.), coated on the emulsion side with the release composition of Example 3, was placed on the lower glass platen of the unit, with the coated side up. A 185-mil dam frame was adhered to the negative and F025-4R photopolymerizable resin (Hercules Incorporated, Wilmington, Del.) was hand-poured onto the negative, to create a thickness of about 130 mil. The exposed resin+compressible layer was placed on top of the resin, with the front face of the layer directed toward the F025-4R resin and the back face of the layer directed upwards. The resulting structure was covered with a polyester (Mylar®) layer to protect the glass platens from excess resin squeeze-out. The upper frame of the Merigraph® unit was lowered onto the back-side of the compressible layer, and allowed to settle for two minutes. The plate was exposed through the negative on the lower glass for 15 minutes at an actinic radiation intensity of 5.5 mW/cm$^2$.

The Hilux™ negative was easily removed from the exposed plate. The plate was developed in a rotary Merigraph® system washout unit (Hercules Incorporated, Wilmington, Del.) for ten minutes using an aqueous detergent, and specifically washout product EPD 1695 (Hercules Incorporated, Wilmington, Del.) at 90° F. and 40 psi pressure. The plate was post-exposed in a Merigraph® System Post Ex unit (Hercules Incorporated, Wilmington, Del.) for ten minutes at 12 mW/cm$^2$. The resulting plate was dried using forced air at a temperature of 90° F. for 30 minutes.

The finished plate was 245 mil thick with 90 mil relief. Adhesion between the compressible layer and the cured photopolymerizable layer was excellent. The resulting printing plate had the desired configuration of raised relief.

EXAMPLE 3

A release composition useful in the preparation of printing plates was prepared by combining 2 g Nitrocellulose RS ½ sec (Hercules Incorporated, Wilmington, Del.), 0.1 g lecithin (W.A. Cleary Co, Somerset, N.J.), 0.25 g synthetic spermaceti (Koster Keunen, Inc., Watertown, Conn.)), 0.1 g Mona Wet MO-70 (Mona Industrials, Incorporated, Patterson, N.J.) and 47.5 g butyl acetate. The mixture was stirred, using an electrically powered propeller as found in a Jiffy or Lightening Mixer, for about 2 minutes to achieve a homogeneous release composition.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A process for forming a laminate bearing a relief image, comprising the steps:
   (a) on a surface of a compressible layer wherein said surface is comprised of open cells, directly coating without any intermediate layer, a floor layer comprising at least one layer of a photopolymerizable resin, and exposing said floor layer to first actinic radiation exposure to provide an incompletely cured floor layer;
   (b) coating said incompletely cured floor layer with at least one layer of a photopolymerizable resin to provide a relief layer, and exposing said incompletely cured floor layer and said relief layer to second actinic radiation exposure passed through an image-bearing transparency to provide a substantially cured floor layer and partially cured relief layer; and
   (c) developing said partially cured relief layer to provide a laminate bearing a relief image.

2. The process of claim 1 comprising the step of mechanically forcing at least some photopolymerizable resin of said floor layer into at least some of said open cells of said compressible layer.

3. The process of claim 2 wherein said step of mechanically forcing comprises placing a coverfilm over said photopolymerizable resin of said floor layer, and forcing said coverfilm against said photopolymerizable resin to push at least some of said photopolymerizable resin into at least some of said open cells of said compressible layer.

4. The process of claim 2 wherein said step of mechanically forcing comprises applying a knife blade to said photopolymerizable resin of said floor layer to push at least some of said photopolymerizable resin into at least some of said open cells of said compressible layer.

5. The process of claim 1 wherein said floor layer has a thickness, excluding resin present in cells of said compressible layer, of about 5 mil to about 100 mil.

6. The process of claim 1 wherein the photopolymerizable resin of step (a) has a UV absorbency which is greater than a UV absorbency of the photopolymerizable resin of step (b).

7. The process of claim 1 wherein said first actinic radiation exposure is directed from said floor layer toward said compressible layer.

8. The process of claim 1 wherein said compressible layer is at least partially transparent to first actinic radiation exposure, and at least some of said first actinic radiation passes through said compressible layer into said floor layer.

9. The process of claim 1 wherein said incompletely cured floor layer is incompletely cured at a surface in contact with said relief layer.

10. The process of claim 1 wherein a barrier to oxygen does not cover said floor layer when said floor layer is exposed to first actinic radiation exposure.

11. The process of claim 1, wherein coating said incompletely cured floor layer with at least one layer of a photopolymerizable resin according to step (b) provides an interface layer comprising photopolymerizable resin from said incompletely cured floor layer in blend with photopolymerizable resin from said relief layer.

12. The process of claim 1 wherein said second actinic radiation passes through an image-bearing transparency and is then directed through said relief layer toward said compressible layer.

13. The process of claim 12 wherein said compressible layer is substantially opaque to said second actinic radiation exposure.

14. The process of claim 12 wherein a protective layer, substantially transparent to said second actinic radiation, and substantially non-adhering to said relief layer, is disposed between said relief layer and said image-bearing transparency, to prohibit said image-bearing transparency from directly contacting said relief layer.

15. The process of claim 14, wherein said protective layer is a polymeric film comprising a material selected from the group consisting of polypropylene, polyethylene, polyester, cellulose acetate and polystyrene.

16. The process of claim 15 wherein said image-bearing transparency has an emulsion side, and the polymeric film is laminated to the emulsion side of said transparency.

17. The process of claim 14 wherein said protective layer is a release composition comprising nitrocellulose at a concentration of about 0.5% to about 8%, lecithin at a concentration of about 0.05% to about 5%, spermaceti at a concentration of about 0.01% to about 0.5% and butyl acetate at a concentration of about 90.5% to about 99.4%, wherein the percentages are by weight based on the total weight of the release composition.

18. The process of claim 1 wherein said compressible layer is at least partially transparent to actinic radiation, and said second actinic radiation passes through said image-bearing transparency and is then directed through said compressible layer toward said relief layer.

19. The process of claim 1 wherein step (a) comprises coating said compressible layer with a first layer of a photopolymerizable resin, mechanically forcing at least some of said resin of said first layer into at least some open cells of said compressible layer, incompletely curing said resin of said first layer by exposing said first resin of said first layer to first actinic radiation without a barrier to oxygen positioned over said first layer in order to provide an incompletely cured floor layer.

20. The process of claim 1 wherein step (a) comprises coating a first layer of a photopolymerizable resin onto said compressible layer, mechanically forcing at least some of said resin into at least some open cells of said compressible layer, covering said first layer with a second layer of a photopolymerizable resin, and exposing said first and second layers to first actinic radiation without a barrier to oxygen positioned over said second layer in order to provide an incompletely cured floor layer.

* * * * *